(12) United States Patent
Takagi et al.

(10) Patent No.: US 7,332,829 B2
(45) Date of Patent: Feb. 19, 2008

(54) CONDITION MONITOR SYSTEM RESPONSIVE TO DIFFERENT INPUT PULSES

(75) Inventors: Nobutomo Takagi, Okazaki (JP); Makoto Kawatsu, Anjo (JP); Yasuhiro Tanaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 494 days.

(21) Appl. No.: 10/901,135

(22) Filed: Jul. 29, 2004

(65) Prior Publication Data

US 2005/0046555 A1   Mar. 3, 2005

(30) Foreign Application Priority Data

Aug. 19, 2003  (JP)  ............................. 2003-295510

(51) Int. Cl.
*H01H 9/56*  (2006.01)

(52) U.S. Cl. .................................. 307/10.1; 307/296.4

(58) Field of Classification Search ................ 307/10.1
See application file for complete search history.

(56) References Cited

U.S. PATENT DOCUMENTS 5,180,927 A * 1/1993 Poletto ........................ 327/198

6,411,872 B1 * 6/2002 Fujita et al. .................. 701/29

FOREIGN PATENT DOCUMENTS

| JP | A-63-034260 | 2/1988 |
|----|----|----|
| JP | 05346435 | * 12/1993 |
| JP | A-2000-244292 | 9/2000 |

* cited by examiner

*Primary Examiner*—Michael Sherry
*Assistant Examiner*—Luis E. Román
(74) *Attorney, Agent, or Firm*—Posz Law Group, PLC

(57) ABSTRACT

In a condition monitor system for controlling a power supply in a vehicle, a charge/discharge circuit has a capacitor which is discharged in response to each of speed pulses of a speed sensor and periodic pulses of a microcomputer. When none of the pulses are generated due to abnormality, the capacitor is continuously charged without being discharged. When the charge voltage of the capacitor reaches a switching voltage, a relay is turned off to shut off the power supply to various parts in the vehicle. The charge/discharge circuit is commonly used to check generation of the speed pulses and the periodic pulses by setting the switching voltage in accordance with a possible maximum time interval of the speed pulses.

6 Claims, 2 Drawing Sheets

US 7,332,829 B2

CONDITION MONITOR SYSTEM RESPONSIVE TO DIFFERENT INPUT PULSES

CROSS REFERENCE TO RELATED APPLICATION

This application is based on and incorporates herein by reference Japanese Patent Application No. 2003-295510 filed on Aug. 19, 2003.

FIELD OF THE INVENTION

The present invention relates to a condition monitor system having a signal generation circuit which changes its output signal level in response to input pulses.

BACKGROUND OF THE INVENTION

In a conventional condition monitor system, when a certain device fails or does not operate normally, the device is stopped from operating, but allowed to operate under less dangerous condition or reset not to cause abnormality. This system includes a microcomputer and a condition signal generation circuit, which performs predetermined operations such as resetting, when the microcomputer fails to generate periodic pulses due to abnormality. Such a circuit is disclosed in JP 2000-244292, for instance.

In case of an electronic control unit for controlling an electric power supply to various vehicle parts, a condition monitor system is required to avoid uncontrollability of the vehicle parts. Specifically, it is required to maintain the electric power supply to the vehicle parts during vehicle running. It is also required not to shut off the electric power supply irrespective of vehicle running condition as long as a microcomputer for the electric power supply control operates normally.

The vehicle running can be determined based on a time interval of speed pulses successively generated by a vehicle speed sensor. The microcomputer operation condition can be determined based on a time interval of periodic pulses, which is successively generated from the microcomputer. The condition monitor system is preferably constructed to shut off the electric power supply only when both the speed pulses and the periodic pulses are not generated.

The time interval of pulses may be measured by charging and discharging a capacitor, because a charge voltage of the capacitor changes with the length of the interval. The intervals of the speed pulses and the periodic pulses differ largely, and hence the capacitor and its charge/discharge circuit must be provided for each of the speed pulse and the periodic pulse. As a result, the condition monitor system requires many circuit components and becomes large in size.

SUMMARY OF THE INVENTION

It is therefore an object of the present invention to provide a condition monitor system, which is constructed with less number of circuit components and small in size.

According to the present invention, a condition monitor system has a single capacitor which changes a capacitor voltage by alternate charging and discharging. The capacitor is subjected to one of charging and discharging in response to each of pulses different one another. The capacitor is also subjected to the other of charging and discharging after the one of charging and discharging. A condition signal switches its signal level when the capacitor voltage reaches a predetermined level. The capacitor voltage is instantly changed to a fixed level in each operation, and is gradually changed at a rate which allows a continuous change of the capacitor voltage crossing the predetermined level.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
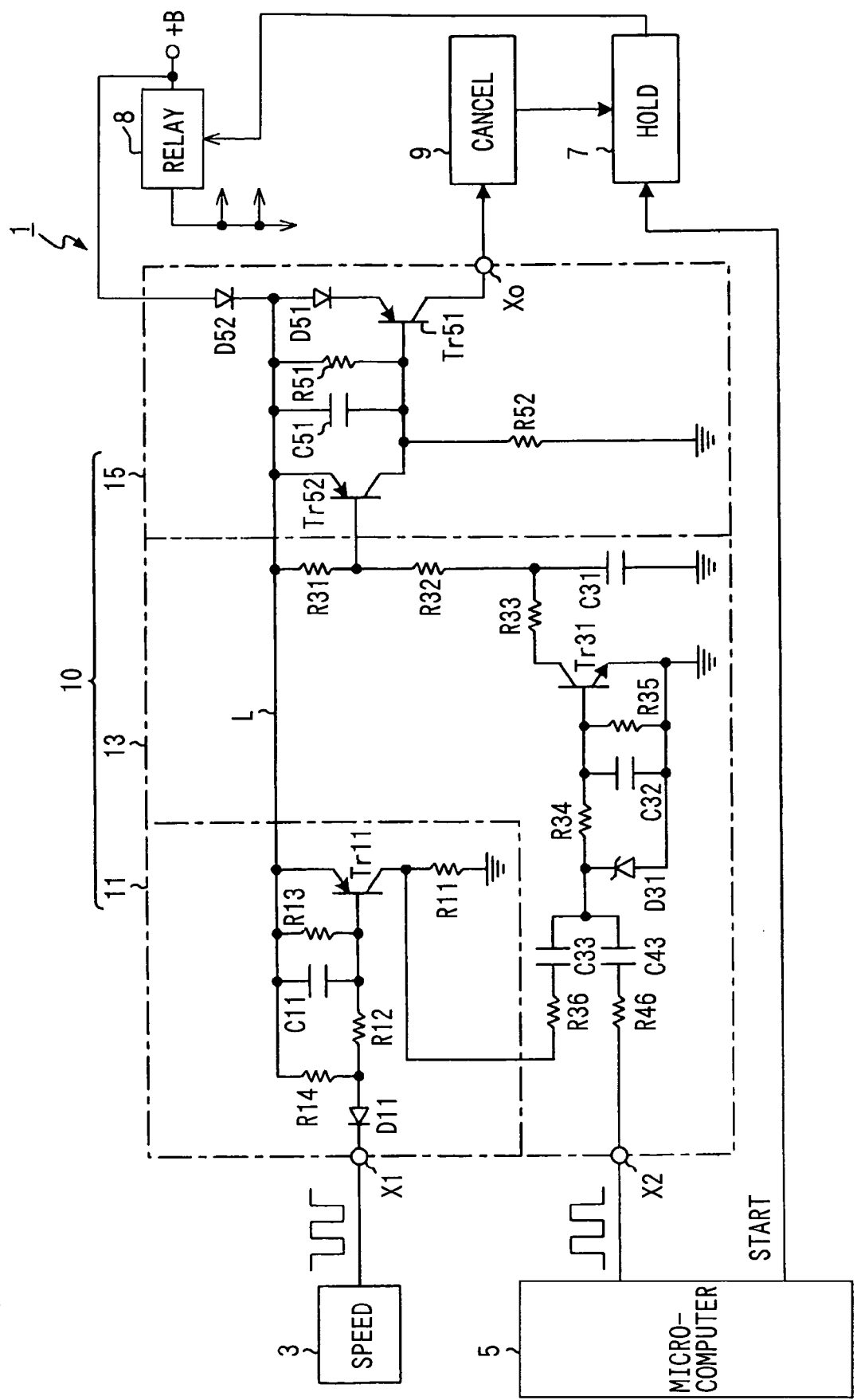
FIG. 1 is a circuit diagram showing a condition monitor system according to an embodiment of the present invention.

Referring first to FIG. 1, a condition monitor system is designated with a reference numeral 1 and constructed as a fail-safe system which shuts off an electric power supply to various vehicle parts when a microcomputer in a vehicle ECU fails to operate properly.

The condition monitor system 1 is comprised of a vehicle speed sensor 3, a microcomputer 5 provided in a vehicle ECU, a hold circuit 7, a relay 8, a cancel circuit 9 and a signal generation circuit 10.

The speed sensor 3 has an encoder attached to a wheel axle and generates speed pulses having time intervals varying with the vehicle speed. The microcomputer 5 generates a start instruction signal for instructing a start of electric power supply to various parts (not shown) of a vehicle according to an operation condition of an ignition switch or a start/stop switch (not shown). The microcomputer 5 further generates periodic pulses having a fixed time interval when operating normally. The signal generation circuit 10 generates a condition signal which becomes an active level (high level) when both speed pulses and periodic pulses are not applied thereto.

The hold circuit 7 turns on the relay 8 provided in an electric power supply line L in response to the start command signal from the microcomputer 5 and holds the ON condition or the relay 8. The cancel circuit 9 turns off the relay 8 held in the ON condition by the hold circuit 7, when the condition signal generated by the signal generation circuit 10 changes to the active level.

The time interval of the speed pulses generated by the speed sensor 3 varies with the vehicle speed (for instance, from 10 ms to 500 ms). The time interval of the periodic pulses generated by the microcomputer 5 is set to the fixed time interval (for instance, 5 ms) shorter than that of the speed pulses. The vehicle is assumed to have stopped when the time interval of the speed pulses reaches a predetermined interval TA (for instance, 500 ms).

The signal generation circuit 10 includes a signal conversion circuit 11, a charge/discharge circuit 13 and an output circuit 15. The signal conversion circuit 11 converts low-active speed pulses applied through an input terminal X1 to a high-active speed pulses (inverted speed pulses). The charge/discharge circuit 13 charges and discharges a capacitor C31 in response to the inverted speed pulses of the signal conversion circuit 11 and the periodic pulses applied through an input terminal X2. The output circuit 15 outputs through an output terminal X0 the condition signal, which becomes the active level (high level) when a charge voltage of the capacitor C31 reaches a predetermined switching voltage Vx.

The signal conversion circuit 11 has a PNP transistor Tr11, which has its emitter connected to the electric power supply line L, its collector connected to the ground through a resistor R11 and a base connected to receive the speed pulses. The collector of the transistor Tr11 is also connected as an input to the charge/discharge circuit 13. A diode D11 and a resistor R12 are connected in series between the input terminal X1 and the base of the transistor Tr11. The anode of the diode D11 is connected to the power supply line L through a resistor R14. A capacitor C11 and a resistor R13 are connected between the base and the emitter of the transistor Tr11. The capacitor C11 is for filtering out signal noises, which are otherwise applied to the base of the transistor Tr11. The resistor R13 is for stabilizing the base potential of the transistor Tr11.

In the signal conversion circuit 11, the transistor Tr11 turns on and off when the speed pulses are at the low level and at the high level, respectively. Thus, the signal conversion circuit 11 produces the inverted speed pulses when the vehicle is traveling, and the inverted pulses are fixed to the low level when the vehicle is at rest.

The output circuit 15 has PNP transistors Tr51 and Tr52. The transistor Tr51 has its collector connected to the cancel circuit 9 to apply its collector output as the condition signal. The transistor Tr51 has its emitter connected to the power supply line L through a diode D51, which generates a bias voltage for surely turning off the transistor Tr51 when the transistor Tr52 turns on. The transistor Tr51 has its base connected to the ground through a resistor R52. The power supply line L is connected to an electric power source (+B) through a diode D52, which prevents a reverse current flow.

A capacitor C51 and a resistor R51 are connected in parallel between the power supply line L and the base of the transistor Tr51. The capacitor C51 is for filtering out signal noises which are otherwise applied to the base of the transistor Tr51. The resistor R51 is for stabilizing the base potential of the transistor Tr51. The transistor Tr52 has its emitter connected to the power supply line L, its collector connected to the base of the transistor Tr51, and its base connected to the charge/discharge circuit 13.

In the output circuit 15, the transistor Tr51 turns off when the transistor Tr52 turns on, and the condition signal applied to the cancel circuit 9 becomes the inactive level (low level). The transistor Tr51, on the other hand, turns on when the transistor Tr52 turns off, and the condition signal applied to the cancel circuit 9 becomes the active level (high level).

The charge/discharge circuit 13 has an NPN transistor Tr31 connected to the capacitor C31. The capacitor C31 is connected to the power supply line L through a series circuit of resistors R31 and R32 at one end and to the ground at the other end. The transistor Tr31 has its collector connected to the non-grounded terminal of the capacitor C31 through a resistor R33, and its emitter connected to the ground. A resistor R35 and a capacitor C32 are connected in parallel between the base and emitter of the transistor Tr31. The junction between the resistors R31 and R32 is connected to the base of the transistor R52 to apply a voltage corresponding to the charge voltage of the capacitor C31 to the transistor Tr52. The resistors R31 and R32 are for charging the capacitor C31 gradually at a predetermined rate (time constant), and the resistor R33 and the transistor Tr31 are for discharging the capacitor C31 instantly.

In the charge/discharge circuit 13, the inverted speed pulses of the signal conversion circuit 11 are applied through a series circuit of a resistor R36 and an AC-coupling capacitor C33. Further, the periodic pulses of the microcomputer 5 are applied through a series circuit of a resistor R46 and an AC-coupling capacitor C43. The capacitors C33 and C43 are connected to the base of the transistor Tr31 through a resistor R34. The voltage levels of the pulses from the capacitors C33 and C34 are clamped by the Zener diode D31 before being applied to the transistor Tr31.

In the charge/discharge circuit 13, the capacitor C32 is charged each time the inverted speed pulses or the periodic pulses rise. The charge accumulated in the capacitor C32 is discharged at a predetermined rate determined by a capacitance of the capacitor C32 and a resistance of the resistor R35. It is noted that resistances of the resistors R34, R35 and a Zener voltage of the Zener diode D31 are determined so that the voltage at the junction between the resistors R34 and R35 becomes sufficiently high to surely turn on the transistor Tr31. As a result, the capacitor C32 is charged in response to the pulses from the signal conversion circuit 11 or the microcomputer 5. The transistor Tr31 is kept turned on during a predetermined period until the charge voltage of the capacitor C32 falls below the ON voltage of the transistor Tr31. The capacitor C31 is instantly discharged to a fixed voltage (0 volt) when the transistor Tr31 turns on.

In the charge/discharge circuit 13, on the contrary, the capacitor C32 is discharged through the resistor R35. If the charge voltage of the capacitor C32 falls below the ON voltage of the transistor Tr31, the transistor Tr31 turns off. The capacitor C31 is gradually charged through the resistors R31 and R32 at the predetermined rate during a time period in which the transistor Tr31 is kept turned off. When at least either of the inverted speed pulses or the periodic pulses is applied, the capacitor C31 is instantly discharged through the resistor R33 and the transistor Tr31.

When the capacitor C31 is kept charged for more than the predetermined period TA (for instance, 500 ms), the charge voltage of the capacitor C31 reaches the switching voltage Vx. The resistances of the resistors R31 and R32 are determined so that the transistor Tr52 turns on and off when the charge voltage of the capacitor C31 is lower and higher than the switching voltage Vx, respectively.

In the fail-safe circuit 1, the hold circuit 7 turns on the relay 8 in the power supply (+B) in response to the start instruction signal from the microcomputer 5, and holds the ON condition of the relay 8.

Figure 2:
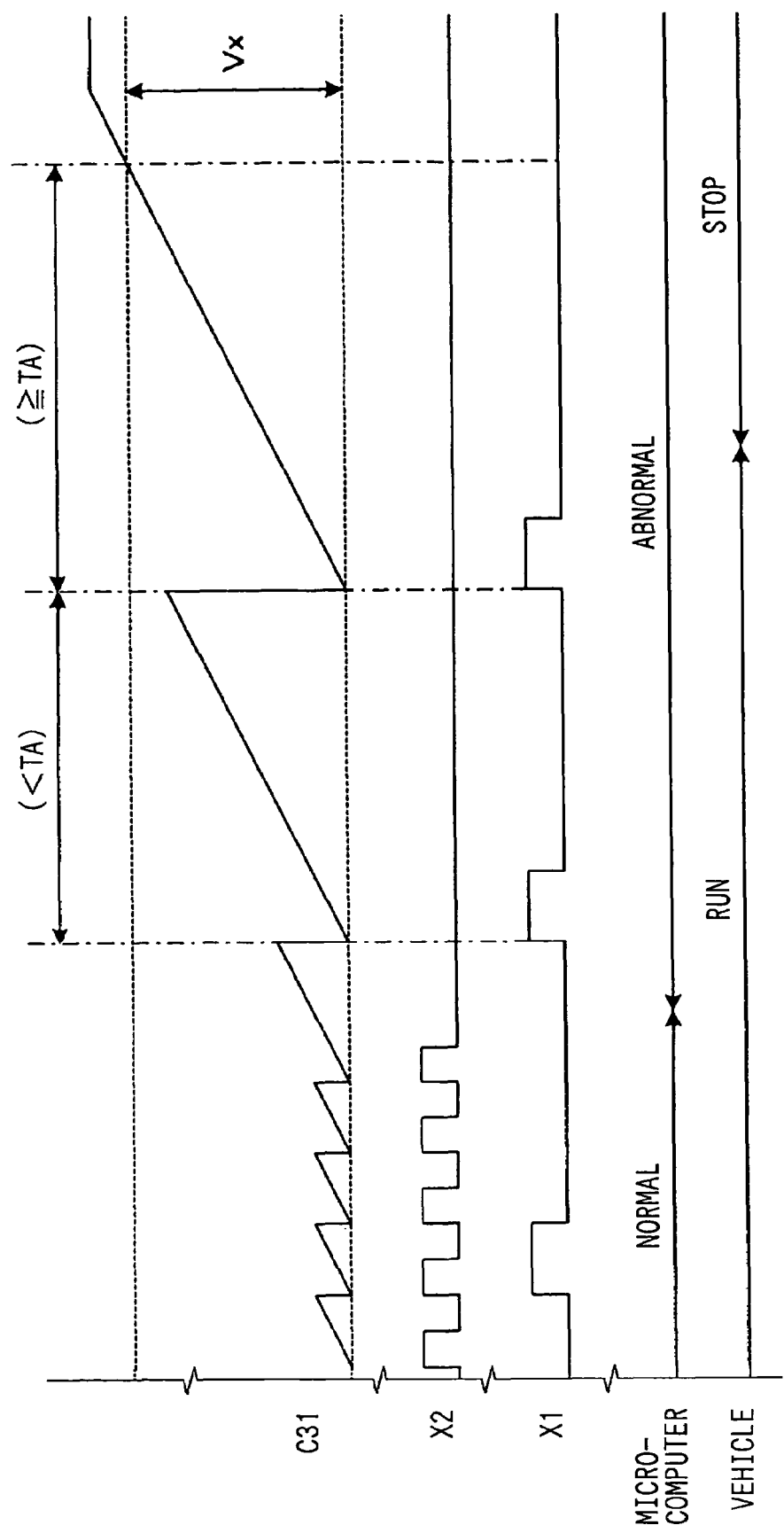
FIG. 2 is a timing diagram showing the operation of the embodiment.

As long as the microcomputer 5 continues to operate normally, the capacitor C31 is discharged periodically through the transistor Tr31 and the resistor R33 in response to the periodic pulses applied from the microcomputer 5 through the input terminal X2 as shown in FIG. 2. As a result, the charge voltage of the capacitor C31 does not reach the switching voltage Vx, and the transistors Tr52 and Tr51 are kept turned on and off, respectively. Thus, the condition signal applied from the output circuit 15 to the cancel circuit 9 through the output terminal X0 remains at the inactive level.

When the microcomputer 5 fails to operate normally and is in an abnormal condition for some reason, it stops producing periodic pulses. The speed sensor 3, however, continues to apply the speed pulses through the input terminal X1 as long as the vehicle is running. As a result, the capacitor C31 is discharged though the transistor Tr31 and the resistor R33 in response to the inverted speed pulses. This discharging is made at an interval shorter than the predetermined interval TA. The charge voltage of the capacitor C31 does not reach the switching voltage Vx as shown in FIG. 2. Thus, the condition signal applied from the output circuit 15 to the cancel circuit 9 remains at the inactive level. As a result, even when the microcomputer 5 fails to operate normally, the power supply to some of vehicle parts are maintained so that the vehicle can be driven to attain a limp-home.

When the microcomputer 5 is in the abnormal condition and the vehicle stops running, the charge of the capacitor C31 is not discharged due to no speed pulses from the speed sensor 3 through the input terminal X1. If no speed pulse is applied for more than the predetermined interval TA, the capacitor C31 is continuously charged and the charge voltage of the capacitor C31 reaches the switching voltage Vx as shown in FIG. 2. As a result, the transistors Tr52 and Tr51 turns off and on, respectively, and the condition signal applied from the output circuit 15 to the cancel circuit 9 is changed to the active level. The cancel circuit 9 causes the hold circuit 7 to stop holding the ON condition of the relay 8. Thus, the power supply to various parts in the vehicle is stopped.

In the condition monitor system 1, only one charge/discharge circuit 13 is used. That is, the capacitor C31 is charged in response to the speed pulses which have longer repetition intervals than that of the periodic pulses and is discharged completely in response to each periodic pulse. Therefore, a charge/discharge circuit need not be separately provided to be responsive to the speed pulses and the periodic pulses. Thus, the apparatus construction is simplified and small-sized.

The above embodiment may be modified in various ways.

For instance, a confirmation switch (not shown) which turns on in response to a driver manipulation may be connected in series with the resistor R52 which grounds the base of the transistor Tr51 in the output circuit 15, and an alarm device may be provided to be activated when the charge voltage of the capacitor C31 reaches the switching voltage Vx. In this instance, the power supply to the various parts in the vehicle will not be stopped immediately even when neither the speed pulses nor the periodic pulses are generated. The power supply may be stopped, only when a driver recognizes the activation of the alarm device and manipulates the confirmation switch. Thus, one more condition to operate the condition monitor system 1 can be added, so that a system using the condition monitor system 1 can be made safer.

Further, in place of the collector output of the transistor Tr51, the collector output of the transistor Tr52 may be used as the condition signal. In this instance, the condition signal from the transistor Tr52 becomes low when neither the speed pulses nor the periodic pulses are generated.

Still further, more than two pulses may be applied to the condition monitor system 1. In this instance, the charge/discharge circuit 13 may have one or more additional series circuit of a resistor and an AC-coupling capacitor in parallel with the series circuits C33-R36 and C43-R46 in correspondence with each increase of input pulses. A charging rate of the capacitor C31 may be set in accordance with a possible maximum time interval among the input pulses.

Still further, the signal generation circuit 10 may be incorporated in any systems other than the fail-safe system, which requires a condition signal when either one of a plurality of input pulses or none of the input pulses is generated.

In addition, the signal generator circuit 10 may be so constructed that the capacitor C31 may be charged instantly to a fixed level in response to each input pulse and discharged gradually at a fixed rate during the time interval and the condition signal level is switched when the capacitor voltage decreases to a predetermined level corresponding to the predetermined period TA.

The above embodiment may be modified further without departing from the spirit of the invention.

What is claimed is:

1. A condition monitor system comprising:
    a plurality of input terminals for receiving pulses different from one another in time intervals of repetition;
    a capacitor for changing a capacitor voltage when charged and discharged in response to the pulses applied to the input terminals;
    a discharging means for discharging the capacitor, the discharging means including a switching device provided in a discharging path to turn on only a predetermined time in response to each of the pulses;
    a charging means for charging the capacitor after the discharging; and
    an output means for generating a condition signal which switches a signal level when the capacitor voltage reaches a predetermined level,
    wherein the discharging means is connected to be responsive to each of the pulses and instantly change the capacitor voltage to a fixed level in each operation, and
    wherein the charging means is connected to gradually change the capacitor voltage at a rate which allows a continuous change of the capacitor voltage crossing the predetermined level, the rate being set in accordance with a possible maximum time interval among the time intervals of the pulses.

2. The condition monitor system according to claim 1, wherein the output means is rendered operative only when a confirmation switch is manipulated.

3. The condition monitor system according to claim 1, further comprising:
    a power control means provided in an electric power supply line of a vehicle for stopping an electric power supply when the condition signal changes the signal level due to the capacitor voltage reaching the predetermined level.

4. The condition monitor system according to claim 1, further comprising:
    a speed sensor for generating, as one of the pulses, speed pulses having a time interval corresponding to a vehicle speed; and
    a microcomputer for controlling a vehicle operation and periodically generating, as another of the pulses, periodic pulses while operating normally.

5. The condition monitor system according to claim 1, wherein
    the rate is set so that the capacitor voltage exceeds the predetermined level when the plurality of input terminals receive no pulses for more than a predetermined time interval.

6. The condition monitor system according to claim 1, wherein
    the output means produces the condition signal only when the plurality of input terminals receive no pulses for more than a predetermined time interval.

* * * * *